(12) United States Patent
Kim

(10) Patent No.: US 7,573,541 B2
(45) Date of Patent: Aug. 11, 2009

(54) LIQUID CRYSTAL DISPLAY HAVING PARTICULAR GROUND STRUCTURE

(75) Inventor: Hyoung-hak Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 671 days.

(21) Appl. No.: 11/399,717

(22) Filed: Apr. 7, 2006

(65) Prior Publication Data
US 2006/0267863 A1 Nov. 30, 2006

(30) Foreign Application Priority Data
May 26, 2005 (KR) .................. 10-2005-0044512

(51) Int. Cl.
*G02F 1/1333* (2006.01)
*G09G 3/30* (2006.01)
(52) U.S. Cl. .............................. 349/59; 349/58; 345/80
(58) Field of Classification Search .................. 349/59, 349/58; 345/80
See application file for complete search history.

(56) References Cited
U.S. PATENT DOCUMENTS 5,432,626 A * 7/1995 Sasuga et al. ............... 349/58
5,838,400 A * 11/1998 Ueda et al. .................. 349/58
5,946,062 A * 8/1999 Hasegawa et al. ........... 349/58
2006/0110949 A1* 5/2006 Jee et al. ..................... 439/64

* cited by examiner

*Primary Examiner*—Mike Qi
(74) *Attorney, Agent, or Firm*—Cantor Colburn LLP

(57) ABSTRACT

An LCD comprising an LCD panel on which an electrode pad is provided; a light source irradiating light to a portion of the LCD panel; a bottom chassis accommodating the light source; a driving part connected to the electrode pad and applying a driving signal to the LCD panel; a driving circuit part controlling the driving part and comprising a first driving circuit board connected to the driving part and disposed on a lateral side of the bottom chassis and a second driving circuit board connected to the first driving circuit board and disposed on portion of the bottom chassis; and an FPC connecting the first driving circuit board to the second driving circuit board and comprising a ground member electrically connected to the bottom chassis, and exposed to the outside. Accordingly, the present invention provides a liquid crystal display decreasing an EMI level of the FPC.

18 Claims, 8 Drawing Sheets

LIQUID CRYSTAL DISPLAY HAVING PARTICULAR GROUND STRUCTURE

This application claims priority to Korean Patent Application No. 2005-0044512, filed on May 26, 2005, and all the benefits accruing therefrom under 35 U.S.C. §119, the contents of which are incorporated herein by reference in its entirety.

BACKGROUND OF THE INVENTION

1. Field of the Invention

The present invention relates to a liquid crystal display having a printed circuit board respectively disposed on a lateral side and a rear portion of a bottom chassis.

2. Description of the Related Art

Generally, a liquid crystal display (hereinafter, referred to as 'LCD') is a device that displays images via adjusting light transmittance through liquid crystal cells aligned in a matrix form according to an image signal. Images are formed on an LCD panel using light radiated from a backlight unit.

The LCD comprises a LCD panel on which liquid crystal cells comprised in a pixel unit are aligned in a matrix form, a driving part to drive the liquid crystal cells, a driving circuit part provided with a circuit pattern to control the driving part, a backlight unit configured to provide light in a substantially uniform manner to the LCD panel, and a bottom chassis accommodating the above.

Generally, an end of the driving part is connected to an electrode pad provided on the verge of the LCD panel and is extended to a lateral side of the LCD panel. The driving circuit board is connected to an end portion of the driving part and is disposed on rear portion of the bottom chassis. However, as the size of the LCD has increased, the LCD becomes thicker and the driving part becomes longer. Since the driving part is costly, the manufacturing cost increases when the driving part increases in size. Further, manufacturing efficiency becomes low in an OLB (Outer Lead Bonding) and a modularizing process.

For example in order to manufacture the LCD without increasing the length of the driving part, the driving circuit part can include a first and a second driving circuit board where the first driving circuit board (Source PCB) is connected to an end of the driving part and is disposed on a lateral side of the bottom chassis, and the second driving circuit board (Control PCB) can be connected to the first driving circuit board through the flexible printed circuit (FPC) and is disposed on a portion, (for example, a rear portion) of the bottom chassis.

As new technology is employed in order to improve a high resolution, a response time, etc. of the LCD, as a high voltage is applied and a driving frequency increases, a characteristic of the EMI of the LCD weakens. For example, in a 2-PCB structure having the driving circuit board 31,33 that includes the first and the second driving circuit board 31,33, there can be a high EMI(electric magnetic interference) level.

SUMMARY OF THE INVENTION

Accordingly, it is an aspect of the present invention to provide a liquid crystal display that decreases an EMI level of the FPC.

The foregoing and/or other aspects of the present invention are also achieved by providing an LCD comprising an LCD panel on which an electrode pad is provided; a light source irradiating light to a portion of the LCD panel; a bottom chassis accommodating the light source; a driving part connected to the electrode pad and applying a driving signal to the LCD panel; a driving circuit part controlling the driving part and comprising a first driving circuit board connected to the driving part and disposed on a lateral side of the bottom chassis and a second driving circuit board connected to the first driving circuit board and disposed on portion of the bottom chassis; and an FPC connecting the first driving circuit board to the second driving circuit board and comprising a ground member electrically connected to the bottom chassis, and exposed to the outside.

According to another embodiment of the present invention, the FPC comprises an insulating film; a circuit wire and the ground member, which are formed on one side of the insulating film; a ground layer, which is conductive, formed on the other side of the insulating film; a coating layer formed on the circuit wire; and a plurality of contact holes connecting the ground member and the ground layer.

BRIEF DESCRIPTION OF THE DRAWINGS

The above and/or other aspects and advantages of the present invention will become apparent and more readily appreciated from the following description of the exemplary embodiments, taken in conjunction with the accompanying drawings of which.

DETAILED DESCRIPTION OF THE INVENTION

Figure 1:
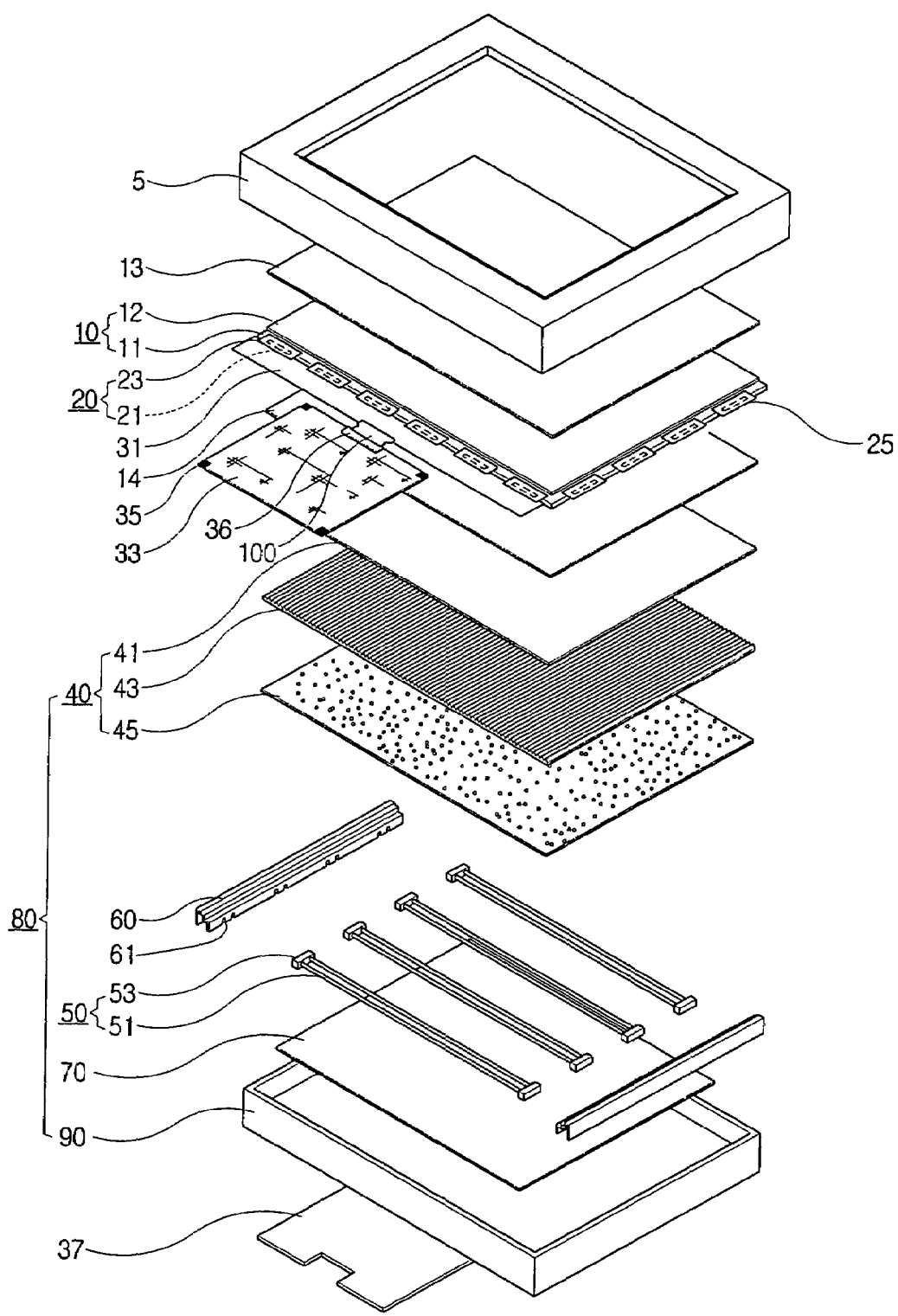
FIG. 1 is an exploded perspective view of an LCD according to an exemplary embodiment of the present invention.

Reference will now be made in detail to exemplary embodiments of the present invention, examples of which are illustrated in the accompanying drawings, wherein like reference numerals refer to like elements throughout. The embodiments are described below in order to explain the present invention by referring to the figures.

It will be understood that, although the terms first, second, front, rear, lateral etc. may be used herein to describe various elements, components, regions, layers, and/or sections, these elements, components, regions, layers, and/or sections should not be limited by these terms. These terms are only used to distinguish one element, component, region, layer or section from another region, layer, or section. Thus, a first element, component, region, layer, or section discussed below could be termed a second element, component, region, layer, or section without departing from the teachings of the present invention.

Figure 2:
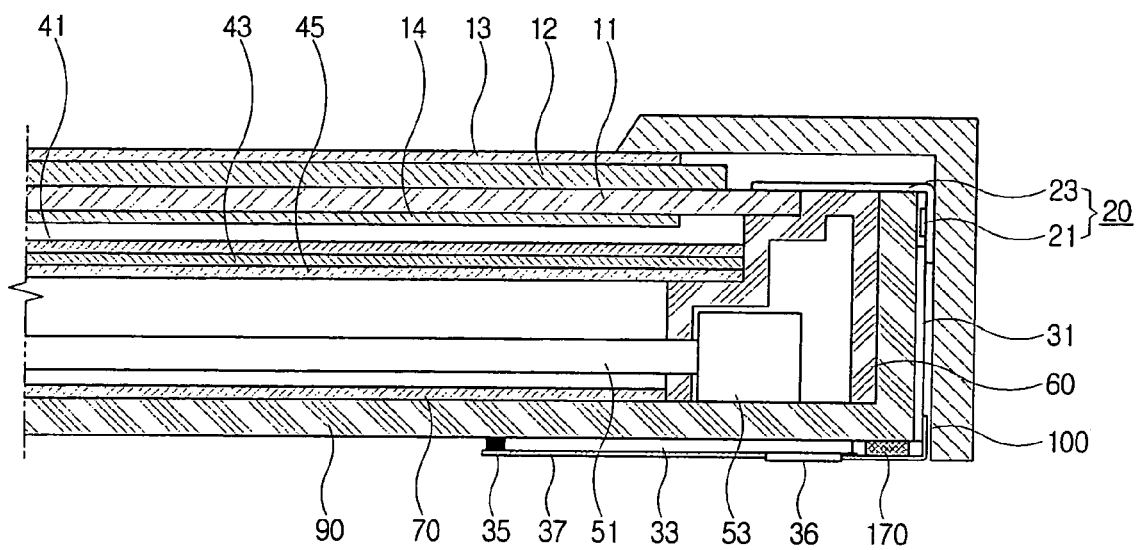
FIG. 2 is a sectional view of the LCD according to an exemplary embodiment of the present invention.

FIG. 1 is an exploded perspective view of an exemplary embodiment of an LCD and FIG. 2 is a sectional view of the LCD according to an exemplary embodiment of the present invention.

The LCD 1 comprises an LCD panel 10 configured to display images; a driving part 20 and 25 driving the LCD panel 10; a first and a second driving circuit board 31,33 controlling the driving part 20 and 25; an FPC (flexible printed circuit) 100 connecting the first and the second driving circuit boards 31,33; a backlight unit 80 irradiating light to a rear portion of the LCD panel 10; a side mold 60 supporting a peripheral portion of the LCD panel 10; a bottom chassis 90 accommodating the backlight unit 80 and the side mold 60; and a top chassis 5 combined to the bottom chassis 5.

The LCD panel 10 comprises a TFT (Thin Film Transistor) substrate 11; a color filter substrate 12 adhered on a face of the TFT substrate 11; and a liquid crystal, not shown, disposed between the two substrates. Also, the LCD panel 10 further comprises polarizers 13,14 respectively adhered on a front surface of the color filter substrate 12 and on a rear of the TFT substrate 11 so that light passing through the LCD panel 10 is crossly polarized. On the abovementioned LCD panel 10 are aligned liquid crystal cells comprised in a pixel unit in a matrix form so an image is formed thereon by adjusting light transmittance of the liquid crystal cells according to an image signal transmitted from the driving part 20 and 25.

A plurality of gate lines G1-Gn and a plurality of data lines D1-Dm are formed on the TFT substrate 11 in a matrix form and a TFT is on a crossing face of the gate line and the data line. A signal voltage transmitted from the driving part 20 and 25 is applied between a pixel electrode and a common electrode of the color filter substrate 12, later described in detail, so the liquid crystal may be substantially aligned by the signal voltage, thereby adjusting the light transmittance.

The color filter substrate 12 comprises a color filter on which a red, green, and blue color filter or a cyan, magenta, and yellow color filter may be repeatedly formed on the boundary of a black matrix and the common electrode. The common electrode comprises a transparent conductive substance such as ITO(Indium Tin Oxide), IZO(Indium Zinc Oxide), or the like. The color filter substrate 12 generally has a smaller area than the TFT substrate 11.

Figure 6:
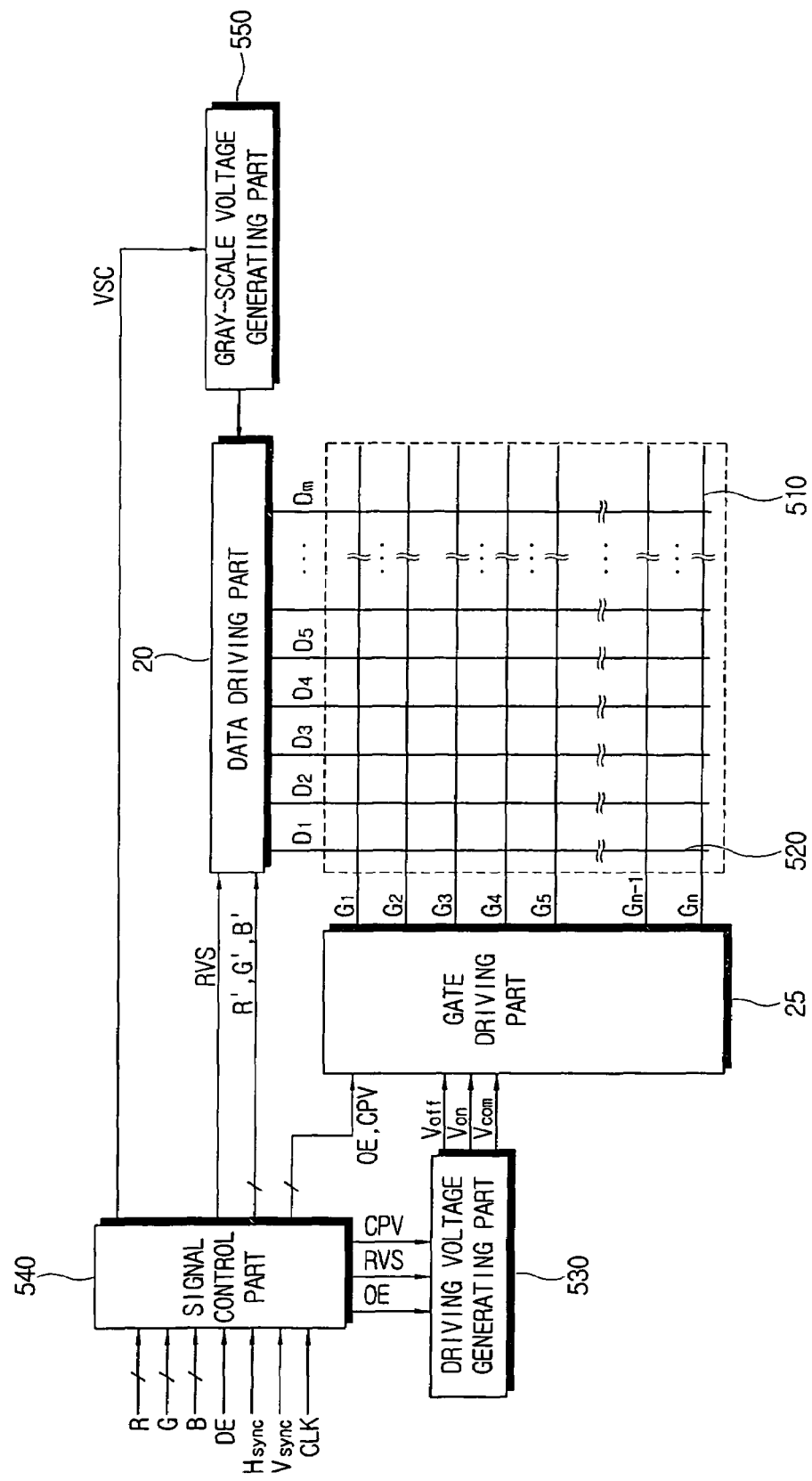
FIG. 6 is a block view of the LCD according to an exemplary embodiment of the present invention.

The data driving part 20 is provided, for example, in a COF (chip on film) method and comprises a driving chip 21 configured to apply a driving signal, and a circuit film 23 on which the driving chip 21 is seated and a side thereof is connected to an end of the data line of the TFT substrate 11. The data driving part 20 is extended to a lateral side of bottom chassis 90 with the circuit film 23 being bent. The liquid crystal disposed between the TFT substrate 11 and the color filter substrate 12 is applied with the driving signal from the data driving part 20 and is substantially realigned. The data driving part 20 is connected to an end of the data line. The data driving part 20, as shown in FIG. 6, also named a source driver, is applied with a gray-scale voltage from a gray-scale voltage generating part 550 and applies the gray-scale voltage to a data line 520 according to control by a signal control part 540.

Meanwhile, a gate driving part 25 connected to an end of a gate line 510 is connected to a lateral side of the LCD panel 10. The gate driving part 25 can be provided in the same method as the abovementioned data driving part 20 and is provided with a signal and a voltage which are for driving a driving circuit part (the first and the second driving circuit boards 31, 33) through the data driving part 20. The gate driving part 25, also named a scan driver, is connected to the gate line 510 and applies a gate signal, that can comprise a gate-on voltage and a gate-off voltage from a driving voltage generating part 530, to the gate line 510.

Figure 3:
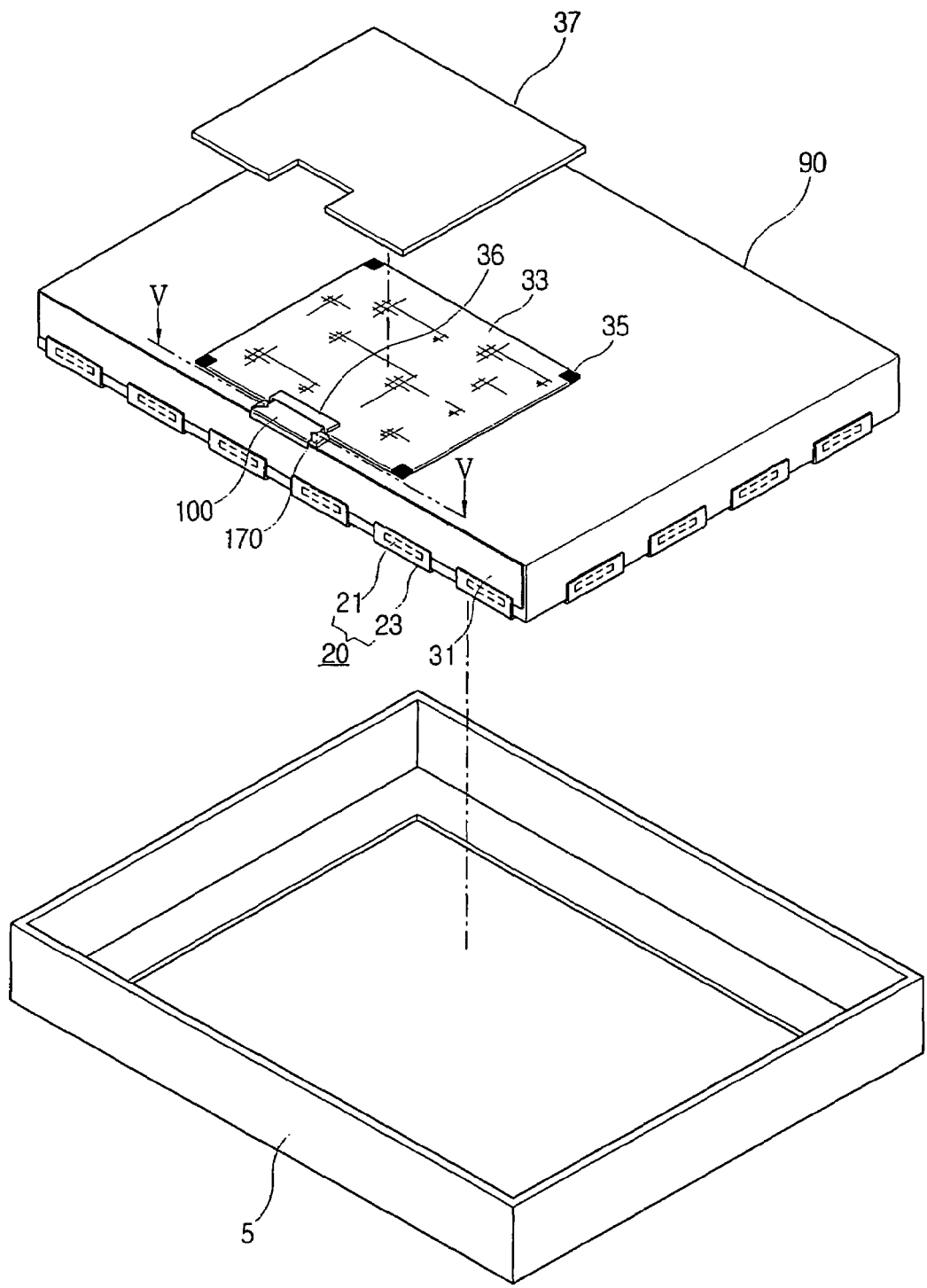
FIG. 3 is a perspective view of a rear portion of the LCD according to an exemplary embodiment of the present invention.

The driving circuit part 31,33 includes the first and the second driving circuit boards 31,33, as shown in FIG. 3. The first driving circuit board (Source PCB) 31 is connected to a portion of the driving part 20 and 25 and is disposed on one lateral side of the bottom chassis 90. The second driving circuit board (Control PCB) 33 is connected to the first driving circuit board 31 by the FPC 100 and is disposed on portion (for example a rear portion) of the bottom chassis 90.

The second driving circuit board 33 may include a predetermined circuit pattern and a plurality of parts connected to the circuit pattern so as to be configured for controlling the driving part 20 and 25. Further, on the second driving circuit board 33 an electric source connector, not shown, can be provided with voltage from outside and a connector 36 connected to the FPC 100.

The second driving circuit board 33 may further comprise the driving voltage generating part 530 and a signal control part 540. As shown in FIG. 6, the driving voltage generating part 530 may generate the gate-on voltage (Von) turning on the TFT Q, a gate-off voltage (Voff) turning off a switching element, a reference voltage (VADD), and a common voltage (Vcom) applied to a common electrode. The signal control part 540 may generate a control signal controlling the gate driving part 25, the data driving part 20, the driving voltage generating part 530, and a gray-scale voltage generating part 550. The control signal may include, but is not limited to, an RGB gray signal (R,G, B), a data enable signal (DE), a horizontal or vertical synchronization signal (Vsync or Hsync), a main clock signal (CLK), a reverse control signal (RVS), gate on enable signal (OE) or gate clock signal (CPV).

The control signal and the voltage generated in the second driving circuit board 33 are applied to the first driving circuit board 31 through the FPC 100. The first driving circuit board 31 converts the control signal applied from the second driving circuit board 33 into a proper signal to control the driving part 20 and 25 and applies it to the driving part 20 and 25. For example, the first driving circuit board 31 transmits the gate-on voltage (Von), the gate-off voltage (Voff), and the common voltage (Vcom), which are generated in the second driving circuit board 33, to the driving part 20 and 25. Also, the gray-scale voltage generating part 550 provided on the first driving circuit board 31 may convert the reference voltage (VADD) into a γ-voltage (gray-scale voltage) and apply it to the driving part 20. The gray-scale voltage generating part 550 generates, using the reference voltage (VADD), a plurality of gray-scale voltages related to brightness of the LCD 1.

Meanwhile, the second driving circuit part 33 may further comprise the gray-scale voltage generating part 550. The gray-scale voltage generating part 550 may convert the reference voltage (VADD) into a γ-voltage (gray-scale voltage) and apply it to the first driving circuit part 31.

A ground part 35 connecting the second driving circuit board 33 and the bottom chassis 90 is provided on portion of the second driving circuit board 33. The ground part 35 may be made of conductive substance, for example like copper (Cu), and decreases an EMI (electric magnetic interference) level generated in the second driving circuit board 33. As illustrated in FIG. 3, the ground part 35 can include a plurality of ground parts 35. A ground member or wire 130 of the FPC 100, later described in detail, may be connected to the ground part 35 of the second driving circuit board 33.

Referring to FIG. 3, the LCD 1 may further comprise a circuit protection board 37 configured to protect the second driving circuit board 33 and or configured for intercepting the EMI generated in the second driving circuit board 33. The circuit protection board 37 can substantially cover the second driving circuit board 33 and be screwed to the bottom chassis 90.

Figure 5:
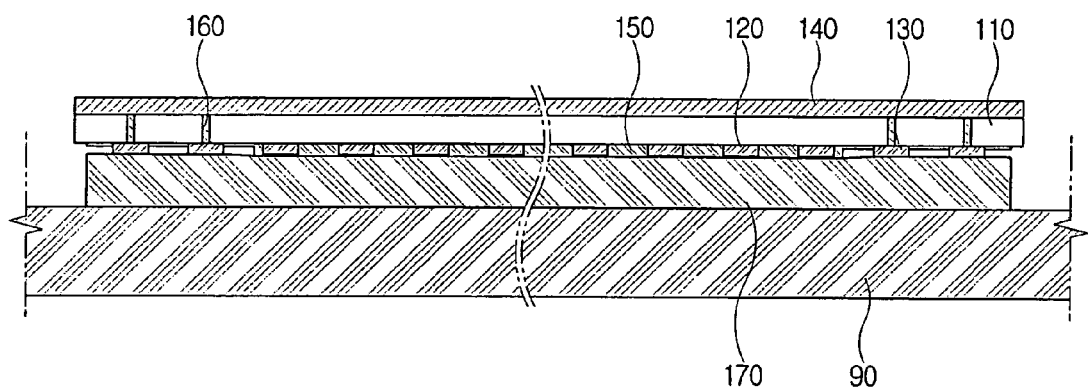
FIG. 5 is a sectional view, taken along line V-V of FIG. 2.

The FPC 100 connects the first driving circuit board 31 and the second driving circuit board 33 and is electrically connected to the bottom chassis 90. As shown in FIG. 5, the FPC 100 comprises an insulating film 110; a circuit wire 120 and the ground member or wire 130 formed on one side of the insulating film; a ground layer 140, which is conductive, formed on the other side of the insulating film 110; a coating layer 150, which is insulating, formed on the circuit wire 120; and a plurality of contact holes 160 connecting the ground wire 130 and the ground layer 140. Further, the ground layer 140 may be coated with the insulating layer, not shown. It should be noted that the ground member or wire 130 can have many configurations and not limited to that of a wire shaped member.

Figure 4:
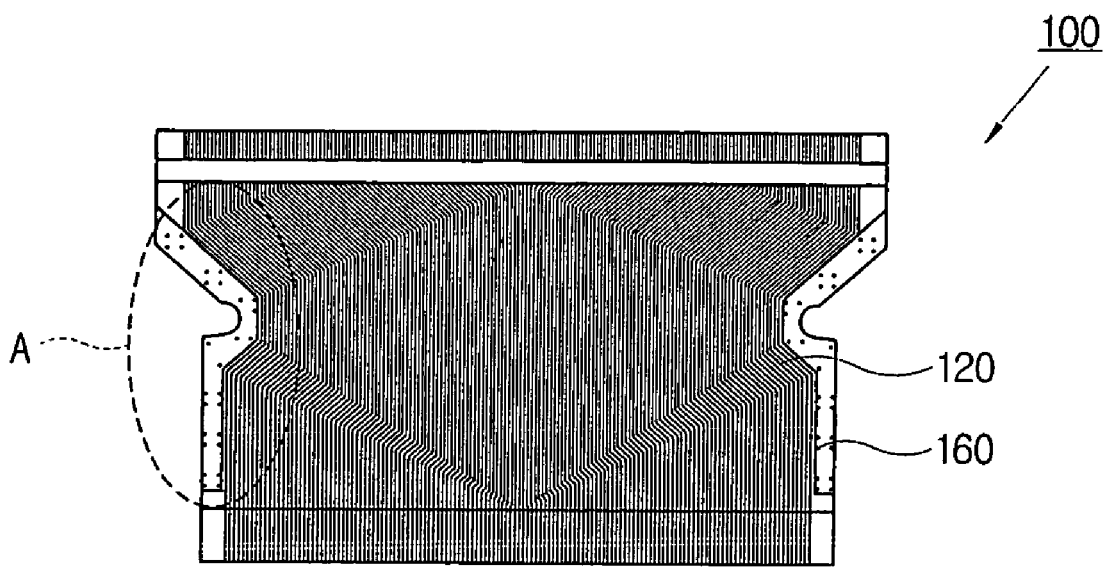
FIG. 4 is a rear view of an FPC according to an exemplary embodiment of the present invention.

As shown FIGS. 4 and 5, the ground wire 130 can be disposed on both verges of the circuit wire 120, namely both verges of the insulating film 110, and exposed to the outside with the coating layer 150 removed. The ground wire 130 with the coating layer 150 removed contacts a gasket 170, which is conductive, and connected to the bottom chassis 90. Furthermore, the ground wire 130 is electrically connected to the conductive ground layer 140 formed on the other side of the insulating film 110 through the contact hole 160. Therefore, a closed circuit is made to continually connect the ground layer 140, the contact hole 160, the ground wire 130, the gasket 170, and the bottom chassis 90.

As new technology is employed in order to improve a high resolution, a response time, etc. of the LCD 1, as a high voltage is applied and a driving frequency increases, a characteristic of the EMI of the LCD 1 weakens. For example, in a 2-PCB structure where the driving circuit board 31,33 includes the first and the second driving circuit board 31,33, there can be a high EMI level, since the ground structure of the FPC 100 connecting the first driving circuit board 31 and the second driving circuit board 33 is not strong.

However, according to an exemplary embodiment of the present invention, since the circuit wire 120 in which a high voltage flows is disposed in the closed circuit and the FPC 100 is directly connected to the bottom chassis 90, the EMI generated in the FPC 100 flows to the outside and the EMI level of the FPC 100 decreases. That is, although a high voltage is used and a driving frequency increases, the ground member or wire 130 of the FPC 100 can be directly connected to the bottom chassis 90, thereby strengthening the ground structure of the FPC 100. Therefore, the EMI level generated in the FPC 100 decreases.

Further, the ground structure may also be strengthened, since the ground wire 130 is connected to the ground part 35 of the second driving circuit board 33.

The backlight unit 80 disposed in rear portion of the LCD panel 10 comprises optical sheets 40, a light source part 50, and a reflecting sheet 70 as shown in FIGS. 1 and 2.

The optical sheets 40 comprise a protection sheet 41 disposed in a rear portion of the LCD panel 10, a prism sheet 43, and a diffusion sheet 45. The diffusion sheet 45 may comprise a base plate and a coating layer having beads formed on the base plate. The diffusion sheet 45 diffuses light from a light source 51 and provides it to the LCD panel 10. A plurality of the diffusion sheets 45 may be used in an overlapping configuration. A triangular prism can be formed on the prism sheet 43 at a predetermined alignment. The prism sheet 43 concentrates light diffused from the diffusion sheet 45 in a substantially perpendicular direction of a surface of the LCD panel 10. For example, a plurality of prism sheets 43 can be used where the triangular prism formed on each prism sheet 43 makes a predetermined angle with respect to another triangular prism. Light passing through the prism sheet 43 progresses substantially perpendicular, thereby forming a substantially uniform brightness distribution. The protection sheet 41 disposed on the top of the backlight unit 80 protects the prism sheet 43 vulnerable to a scratch.

The light source part 50 comprises the light source 51 radiating light and a light source electrode, not shown, formed at an end of the light source 51, and is provided with an electric source from an inverter, not shown. A plurality of light sources 51 are arranged substantially parallel with one another in a rear portion of the LCD panel 10 and end parts of the light sources 51 are inserted into a light source holder 53. The light source 51 may use, for example, a CCFL (Cold Cathode Fluorescent Lamp), an EEFL (External Electrode Fluorescent Lamp), or the like has advantages of high brightness, low cost, and low consumption of an electric source and may drive a plurality of the light source part 50 with a single inverter.

The side mold 60 can have a two-step stair shape, which can be substantially hollow inside and disposed on both lateral sides of the bottom chassis 90. The side mold 60 has a plurality of insertion grooves 61 for accommodating the light source holder 53 inside so the insertion grooves 61 can be combined to the light source 51. A first step of the side mold 60 supports the verge of the optical sheets 40 and a second step of the side mold 60 supports the verge of the LCD panel 10. The LCD panel 10 is separated from the backlight unit 80 by the side mold 60.

The reflecting sheet 70, being disposed between the light source 51 and the bottom chassis 90, reflects light from the light source 51 and provides it substantially in the direction of the diffusion sheet 45. The reflecting sheet 70 may be made of PET (polyethylene terephthalate), PC (polycarbonate), or the like. The reflecting sheet 70 being configured to reflect light directed toward the reflecting sheet 70 away in a direction substantially toward the LCD panel 10, thereby decreases light loss and contributes to improve uniformity of light irradiated in the direction of the LCD panel 10. The reflecting sheet 70 may be adhered to an underside of the bottom chassis 90.

A top chassis 5 comprises a display window (not shown) so that a displaying area of the LCD panel 10 may be exposed to the outside and is combined with the bottom chassis 90.

The bottom chassis 90 accommodates the backlight unit 80 when the bottom chassis 90 is combined with the top chassis 5.

Figure 7:
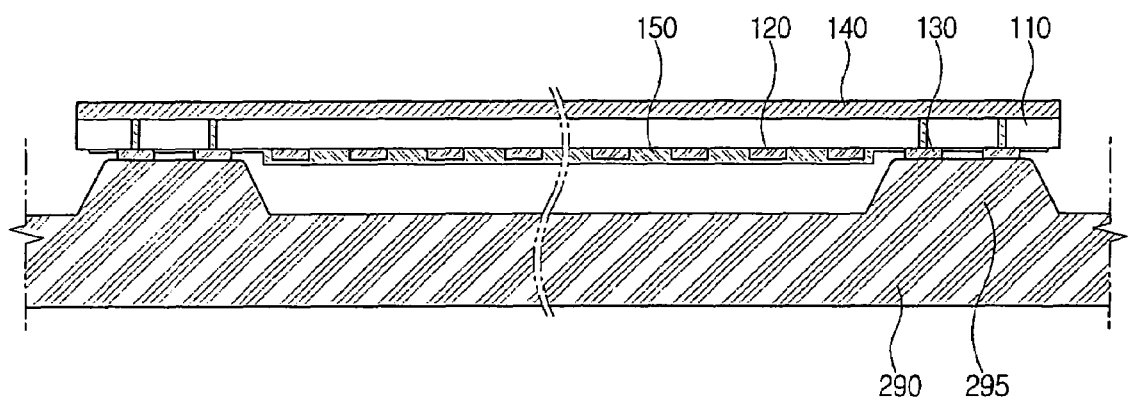
FIG. 7 is a sectional view of an LCD according to an alternative embodiment of the present invention.

Hereinafter, an alternative embodiment of the present invention will be described with reference to FIG. 7. FIG. 7 is a sectional view of an exemplary embodiment of an LCD. A projection 295 can be formed facing a FPC 100 on an area of a bottom chassis 290 corresponding to a ground wire 130 of the FPC 100.

Figure 8:
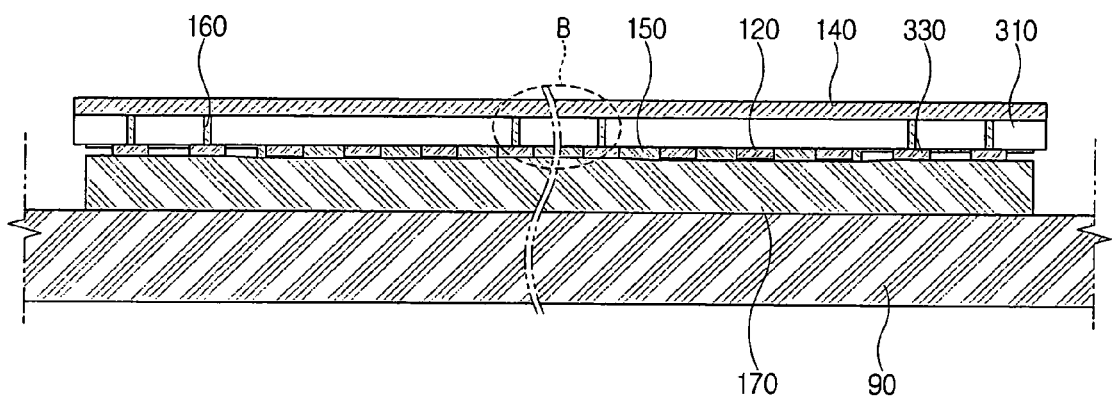
FIG. 8 is a sectional view of an LCD according to an alternative embodiment of the present invention.

Hereinbelow, another alternative embodiment of the present invention will be described with reference to FIG. 8. FIG. 8 is a sectional view of another exemplary embodiment of an LCD. A ground wire 330 can be disposed on both edges and a center B area of an insulating film 310. Accordingly, a ground structure strengthens, thereby considerably decreasing an EMI level generated in an FPC 100. Meanwhile, the ground wire 330 may be formed substantially in the center of the insulating film 310.

Although exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:
1. An LCD comprising:
   an LCD panel on which an electrode pad is provided;

a light source irradiating light to a portion of the LCD panel;

a bottom chassis accommodating the light source;

a driving part connected to the electrode pad and applying a driving signal to the LCD panel;

a driving circuit part controlling the driving part and comprising a first driving circuit board connected to the driving part and disposed on a lateral side of the bottom chassis and a second driving circuit board connected to the first driving circuit board and disposed on portion of the bottom chassis; and an FPC connecting the first driving circuit board to the second driving circuit board and comprising a ground member electrically connected to the bottom chassis, and exposed to the outside.

2. The LCD according to claim 1, wherein the FPC comprises an insulating film; a circuit wire and the ground member, which are formed on one side of the insulating film; a ground layer, which is conductive, formed on the other side of the insulating film; a coating layer formed on the circuit wire; and a plurality of contact holes connecting the ground member and the ground layer.

3. The LCD according to claim 2, further comprising a gasket, which is conductive, connecting the ground wire and the bottom chassis.

4. The LCD according to claim 2, wherein the ground member is formed substantially on the verge of the insulating film.

5. The LCD according to claim 2, wherein the ground member is formed substantially in the center of the insulating film.

6. The LCD according to claim 1, wherein the ground member directly contacts the bottom chassis.

7. The LCD according to claim 1, wherein the bottom chassis comprises a projection facing the FPC and formed on an area of the bottom chassis corresponding to the ground member.

8. The LCD according to claim 1, wherein the second driving circuit board comprises a ground part electrically connected to the bottom chassis and the ground member of the FPC is connected to the ground part.

9. The LCD according to claim 1, wherein the ground part comprises a conductive substance.

10. The LCD according to claim 1, wherein the second driving circuit board comprises a signal control part.

11. The LCD according to claim 1, wherein the second driving circuit board comprises a driving voltage generating part and a gray-scale voltage generating part.

12. The LCD according to claim 1, wherein the ground member comprises a wire.

13. The LCD according to claim 1, further comprising a ground structure comprising the ground member and a ground part, the ground structure configured for reducing an EMI of the FPC when a voltage is applied through the FPC.

14. The LCD according to claim 1, further comprising a circuit protecting board configured to protect the second driving circuit board.

15. The LCD according to claim 14, wherein the circuit protecting board is further configured to intercept EMI generated in the second driving circuit board.

16. The LCD according to claim 1, wherein the display panel comprises a TFT substrate;

a color filter substrate on the TFT substrate;

a polarizer on a surface of the color filter substrate and the TFT substrate;

a gate line and a data line formed on the TFT substrate;

wherein the driving part is connected to the gate line and the data line.

17. An FPC comprising an insulating film; a circuit wire and a ground member, which are formed on one side of the insulating film; a ground layer, which is conductive, formed on the other side of the insulating film; a coating layer formed on the circuit wire; and a plurality of contact holes connecting the ground member and the ground layer.

18. The FPC of claim 17, further comprising a gasket such that a closed circuit is formed by connecting the ground layer, the contact hole, the ground member, the gasket, and the bottom chassis.

* * * * *

UNITED STATES PATENT AND TRADEMARK OFFICE
CERTIFICATE OF CORRECTION

PATENT NO. : 7,573,541 B2  Page 1 of 1
APPLICATION NO. : 11/399717
DATED : August 11, 2009
INVENTOR(S) : Hyoung-hak Kim It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 796 days.

Signed and Sealed this

Fourteenth Day of December, 2010

David J. Kappos
*Director of the United States Patent and Trademark Office*